(12) United States Patent
Jung et al.

(10) Patent No.: US 11,495,611 B2
(45) Date of Patent: Nov. 8, 2022

(54) SEMICONDUCTOR MEMORY DEVICE

(71) Applicant: SK hynix Inc., Icheon-si (KR)

(72) Inventors: Sung Wook Jung, Icheon-si (KR); Jang Hee Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 160 days.

(21) Appl. No.: 16/938,113

(22) Filed: Jul. 24, 2020

(65) Prior Publication Data
US 2021/0327893 A1 Oct. 21, 2021

(30) Foreign Application Priority Data
Apr. 17, 2020 (KR) .......................... 10-2020-0046485

(51) Int. Cl.
| H01L 27/11565 | (2017.01) |
|---|---|
| H01L 27/11519 | (2017.01) |
| H01L 27/11582 | (2017.01) |
| H01L 27/11556 | (2017.01) |
| H01L 27/1157 | (2017.01) |
| H01L 27/11524 | (2017.01) |

(52) U.S. Cl.
CPC .... *H01L 27/11565* (2013.01); *H01L 27/1157* (2013.01); *H01L 27/11519* (2013.01); *H01L 27/11524* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| 9,922,987 B1 * | 3/2018 | Mizutani ............. H01L 27/1157 |
|---|---|---|
| 10,020,317 B2 | 7/2018 | Zhang et al. |

FOREIGN PATENT DOCUMENTS

| KR | 1020170028731 A | 3/2017 |
|---|---|---|
| KR | 1020170115146 A | 10/2017 |
| KR | 1020190006758 A | 1/2019 |
| KR | 1020190010403 A | 1/2019 |
| KR | 1020190042987 A | 4/2019 |
| KR | 1020200042274 A | 4/2020 |
| KR | 1020210129366 A | 10/2021 |

* cited by examiner

*Primary Examiner* — Hsien Ming Lee
(74) *Attorney, Agent, or Firm* — William Park & Associates Ltd.

(57) ABSTRACT

A semiconductor memory device includes an electrode structure including a plurality of gate conductive films stacked on a substrate and a channel array in which a plurality of channel columns passing through the electrode structure are arranged in a second direction. The plurality of channel columns may include a first column whose uppermost plane has a first shape and a second column whose uppermost plane has a second shape. N (N is a natural number equal to more than 1) first columns and N second columns are alternately arranged in a first direction different from the second direction.

20 Claims, 13 Drawing Sheets

SEMICONDUCTOR MEMORY DEVICE

CROSS-REFERENCES TO RELATED APPLICATION

The present application claims priority under 35 U.S.C. § 119(a) to Korean application number 10-2020-0046485, filed on Apr. 17, 2020, in the Korean Intellectual Property Office, which is incorporated herein by reference in its entirety.

BACKGROUND

1. Technical Field

Various embodiments generally relate to an electronic device, and more particularly, to a semiconductor memory device.

2. Related Art

In order to satisfy consumer demand for high performance and low cost, the degree of integration of semiconductor apparatuses has been increased. Particularly, with semiconductor memory devices, because the degree of integration is an important factor in determining product cost, an increased degree of integration is advantageous. Accordingly, three-dimensional semiconductor memory devices each including memory cells arranged in a three-dimensional manner have been proposed.

SUMMARY

A semiconductor memory device having a stable structure and an increased degree of integration is described herein.

In an embodiment, a semiconductor memory device may include an electrode structure including a plurality of gate conductive films stacked on a substrate and a channel array in which a plurality of channel columns passing through the electrode structure are arranged in a second direction. The plurality of channel columns may include a first column whose uppermost plane has a first shape and a second column whose uppermost plane has a second shape different from the first shape. N (N is a natural number equal to or more than 1) first columns and N second columns may be alternately arranged in a first direction different from the second direction.

In an embodiment, a semiconductor memory device may include an electrode structure including a plurality of gate conductive films stacked on a substrate and a channel array in which a plurality of channel columns passing through the electrode structure are arranged in a zigzag manner in a second direction. The plurality of channel columns may include a first column whose uppermost plane has a first shape and a second column whose uppermost plane has a second shape different from the first shape. In any one row of the channel array, N (N is a natural number equal to or more than 1) first columns and M (M is a natural number equal to more than 2) second columns are alternately arranged in a first direction different the second direction.

DETAILED DESCRIPTION

Figure 1A:
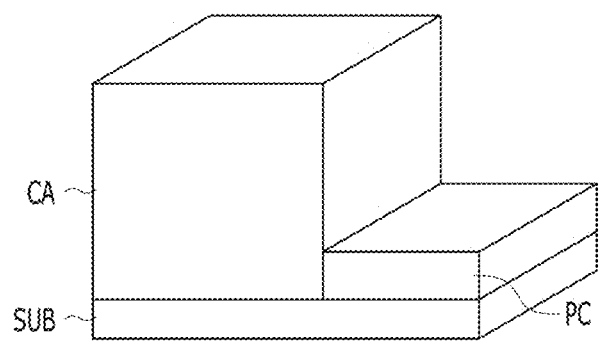
FIG. 1A and FIG. 1B are block diagrams schematically illustrating a semiconductor memory device in accordance with an embodiment of the present disclosure.

The advantages and features of the present disclosure and methods for achieving them will become apparent with reference to the following detailed description in conjunction with the accompanying drawings. However, the scope of the present disclosure is not limited to such embodiments and the present disclosure may be realized in various forms. The embodiments to be described below are provided to assist those skilled in the art to understand the scope of the present disclosure in the technical field to which the present disclosure pertains. The present disclosure is defined only by the scope of the appended claims. In the drawings, the sizes and relative sizes of layers and regions may be exaggerated for clarity of explanation. The same reference numerals are used to designate the same elements throughout the specification.

Embodiments of the present disclosure to be described below are to provide a semiconductor memory device having a stable structure and an increased degree of integration. More specifically, the embodiments of the present disclosure to be described below are to provide a semiconductor memory device capable of increasing the degree of integration and simultaneously substantially preventing structural instability and deterioration in operation characteristics due to an increase in the degree of integration. The semiconductor memory device may be a three-dimensional semiconductor memory device based on an electrode structure in which an interlayer dielectric film and a gate conductive film are alternately stacked a plurality of times. In order to increase the degree of integration of the semiconductor memory device, the embodiments of the present disclosure relate to plane shapes of a plurality of channel columns passing through the electrode structure and an arrangement thereof, wherein the plurality of channel columns may include a first column whose uppermost plane has a first shape and a second column whose uppermost plane has a second shape and the first column and the second column may be alternately arranged in one direction.

Hereinafter, semiconductor memory devices in accordance with embodiments of the present disclosure will be described in detail with reference to the drawings. In the embodiments of the present disclosure to be described below, a first direction D1 may be an x-axis direction or a row direction, and a second direction D2 may be a y-axis direction orthogonal to the first direction D1 or a column direction. A third direction D3 may be a z-axis direction orthogonal to the first direction D1 and the second direction D2 or a vertical direction. Furthermore, a fourth direction D4 and a fifth direction D5 may be a diagonal direction having a slope based on or relative to the first direction D1 or the second direction D2 and may be nonparallel to each other.

Meanwhile, it is illustrated in the embodiments of the present disclosure to be described below that the first direction D1 and the second direction D2 are the x-axis direction and the y axis direction, respectively; however, in modified examples, the first direction D1 may be the y-axis direction and the second direction D2 may be the x-axis direction.

Figure 1B:
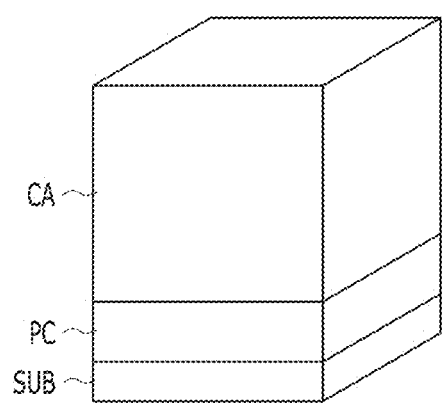

FIG. 1A and FIG. 1B are block diagrams schematically illustrating a semiconductor memory device in accordance with an embodiment of the present disclosure.

As illustrated in FIG. 1A and FIG. 1B, the semiconductor memory device may include a peripheral circuit (PC) and a cell array (CA) arranged on a substrate (SUB).

The substrate (SUB) may be a single crystal semiconductor film. For example, the substrate SUB may be any one of a bulk silicon substrate, a silicon-on-insulator substrate, a germanium substrate, a germanium-on-insulator substrate, a silicon germanium substrate, and an epitaxial thin film formed through a selective epitaxial growth method.

The cell array (CA) may include a plurality of memory blocks. Each of the memory blocks may include a plurality of cell strings. Each of the cell strings may be electrically connected to bit lines, source lines, word lines, and selection lines. Each of the cell strings may include memory cells and selection transistors connected in series. Each of the selection lines may be used as a gate electrode of a selection transistor corresponding thereto, and each of the word lines may be used as a gate electrode of a memory cell corresponding thereto.

The peripheral circuit (PC) may include electrical circuit elements such as, for example, transistors (e.g., NMOS transistors and PMOS transistors), resistors, inductors, and/or capacitors. The electrical circuit elements may be electrically connected to the cell array (CA). As one example, the NMOS and PMOS transistors, the resistors, and the capacitors may be used as elements constituting a row decoder, a column decoder, a page buffer, and a control circuit.

As illustrated in FIG. 1A, the semiconductor memory device in accordance with an embodiment of the present disclosure may have a structure in which the cell array (CA) and the peripheral circuit (PC) are arranged adjacent to each other on the substrate (SUB).

Furthermore, as illustrated in FIG. 1B, the semiconductor memory device, in accordance with an embodiment of the present disclosure, may have a structure in which the peripheral circuit (PC) and the cell array (CA) are sequentially stacked on the substrate (SUB). In such a case, because the peripheral circuit (PC) overlaps the cell array (CA), it is possible to reduce an area of the substrate SUB occupied by the cell array (CA) and the peripheral circuit (PC). In an embodiment, the peripheral circuit (PC) may be located between the substrate (SUB) and the cell array (CA). The peripheral circuit (PC) may be coupled to channel columns of an electrode structure.

Figure 2:
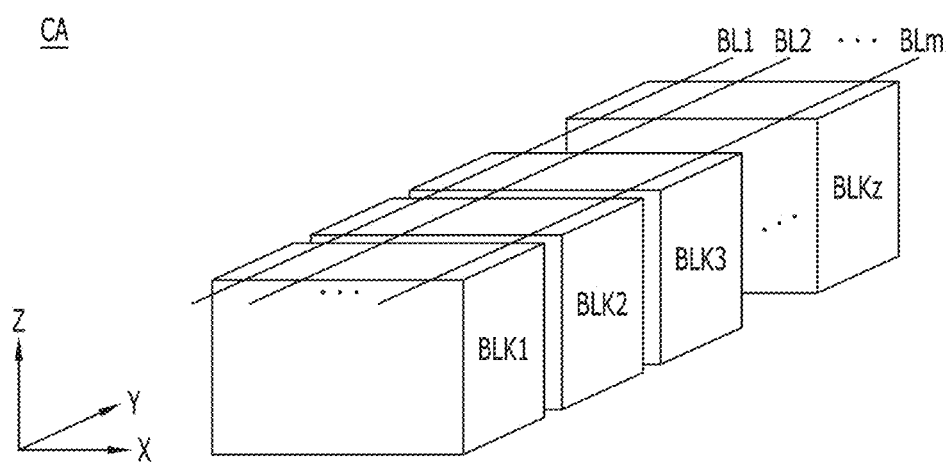
FIG. 2 is a diagram schematically illustrating memory blocks of a semiconductor memory device in accordance with an embodiment of the present disclosure.

FIG. 2 is a diagram schematically illustrating memory blocks of a semiconductor memory device in accordance with an embodiment of the present disclosure.

As illustrated in FIG. 2, the cell array (CA) of the semiconductor memory device in accordance with an embodiment of the present disclosure may include a plurality of memory blocks BLK1 to BLKz. The plurality of memory blocks BLK1 to BLKz may be arranged to be spaced apart from each other in the second direction D2 in which bit lines BL1 to BLm are extended. For example, the first to $z^{th}$ memory blocks BLK1 to BLKz may be arranged to be spaced apart from each other along the second direction D2 and may include a plurality of memory cells stacked along the third direction D3.

Figure 3:
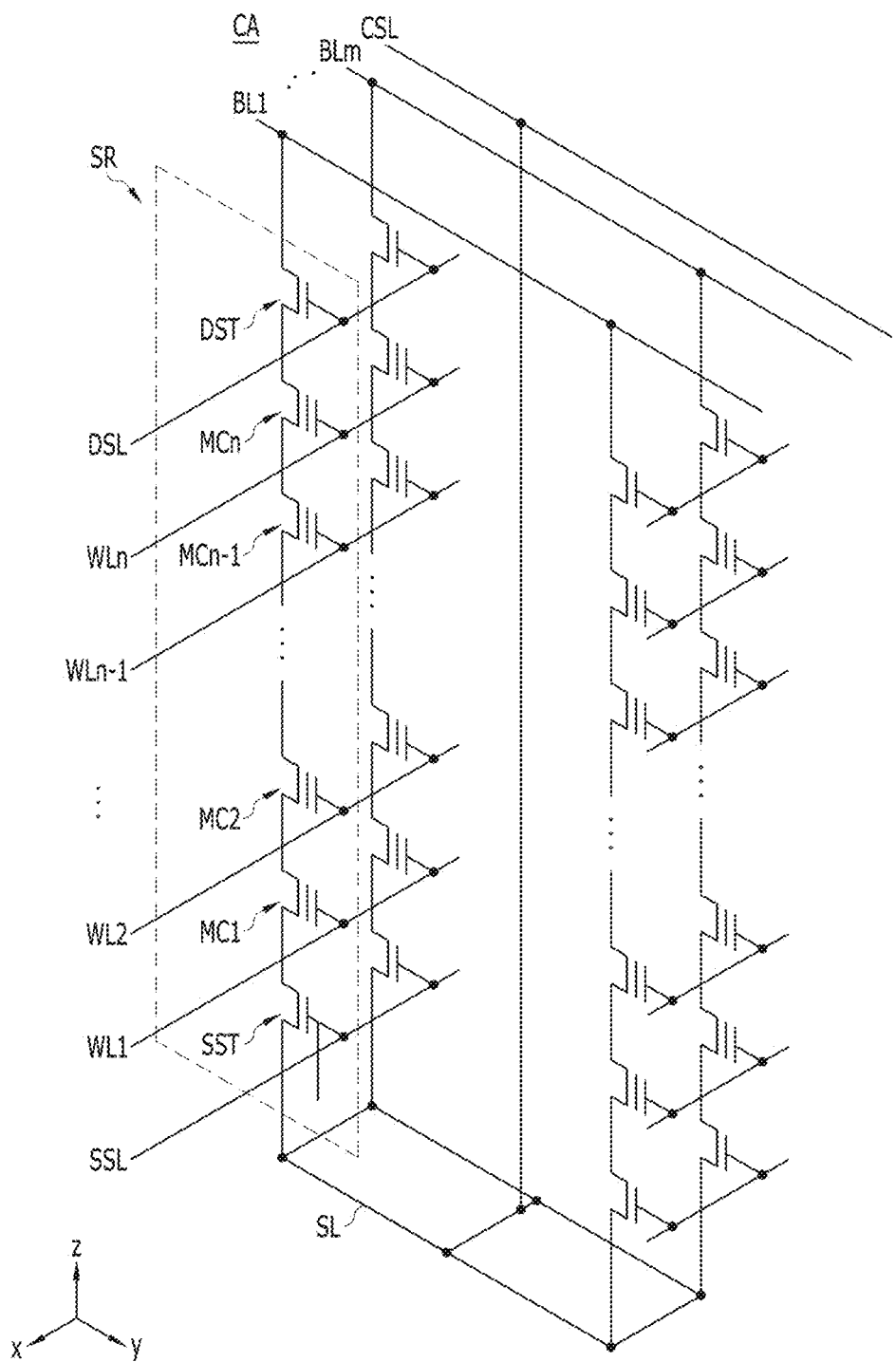
FIG. 3 is an equivalent circuit diagram schematically illustrating memory blocks of a semiconductor memory device in accordance with an embodiment of the present disclosure.

FIG. 3 is an equivalent circuit diagram schematically illustrating memory blocks of a semiconductor memory device in accordance with an embodiment of the present disclosure.

As illustrated in FIG. 3, the cell array (CA) of the semiconductor memory device may include a plurality of memory blocks, and each of the plurality of memory blocks may include a plurality of cell strings (SRs). Each of the cell strings (SRs) may include one or more source select transistors (SSTs), a plurality of memory cell transistors MC1 to MCn, and one or more drain select transistors (DSTs), which are connected in series. Although FIG. 3 illustrates a case where one cell string (SR) includes one source select transistor (SST) and one drain select transistor (DST), each of the source select transistor (SST) and the drain select transistor (DST) may also be composed of a plurality of select transistors connected in series. In such a case, the number of a plurality of source select transistors connected in series may be substantially the same as the number of a plurality of drain select transistors connected in series, or the number of a plurality of source select transistors connected in series may be larger than the number of a plurality of drain select transistors connected in series.

The cell strings (SRs) may be arranged in a matrix form along the first direction D1 and the second direction D2 to form an array. The cell strings (SRs) located on substantially the same line in the second direction D2 may be connected to substantially the same bit line. The cell strings (SRs) located on substantially the same line in the first direction D1 may be connected in common to gate lines SSL, WL1 to WLn, and DSL.

The source select transistor (SST), the plurality of memory cell transistors MC1 to MCn, and the drain select transistor (DST), which constitute one cell string (SR), may share one channel film. The cell strings (SRs) may be arranged between the bit lines BL1 to BLm and a source line SL. The gate lines SSL, WL1 to WLn, and DSL may be stacked between the bit lines BL1 to BLm and the source line SL, and the gate lines SSL, WL1 to WLn, and DSL may be electrically insulated from each other.

The source select line SSL may be used as a gate electrode of the source select transistor (SST), and the word lines WL1 to WLn may be used as gate electrodes of the memory cell transistors MC1 to MCn. The drain select line DSL may be used as a gate electrode of the drain select transistor (DST). The word lines WL1 to WLn may be stacked and arranged in parallel. The source select line SSL may be located below the word lines WL1 to WLn, and the drain select line DSL may be located above the word lines WL1 to WLn.

Each of the bit lines BL1 to BLm may be connected to each of the drain select transistors (DSTs) of the cell string (SR) arranged in the second direction D2 corresponding to each of the bit lines BL1 to BLm. For example, the cell strings (SRs) connected in common to one drain select line DSL may be connected to the bit lines BL1 to BLm different from each other, respectively. Accordingly, when one drain select line DSL is selected and any one of the bit lines BL1 to BLm is selected, any one of the plurality of cell strings (SRs) may be selected.

The source line SL is electrically connected to a common source line CSL. The source line SL may transmit an operating voltage, which is applied to the common source line CSL, to the cell strings (SRs). The operating voltage may be selectively transmitted to the cell string (SR) according to the voltage level of the source select line SSL.

Figure 4:
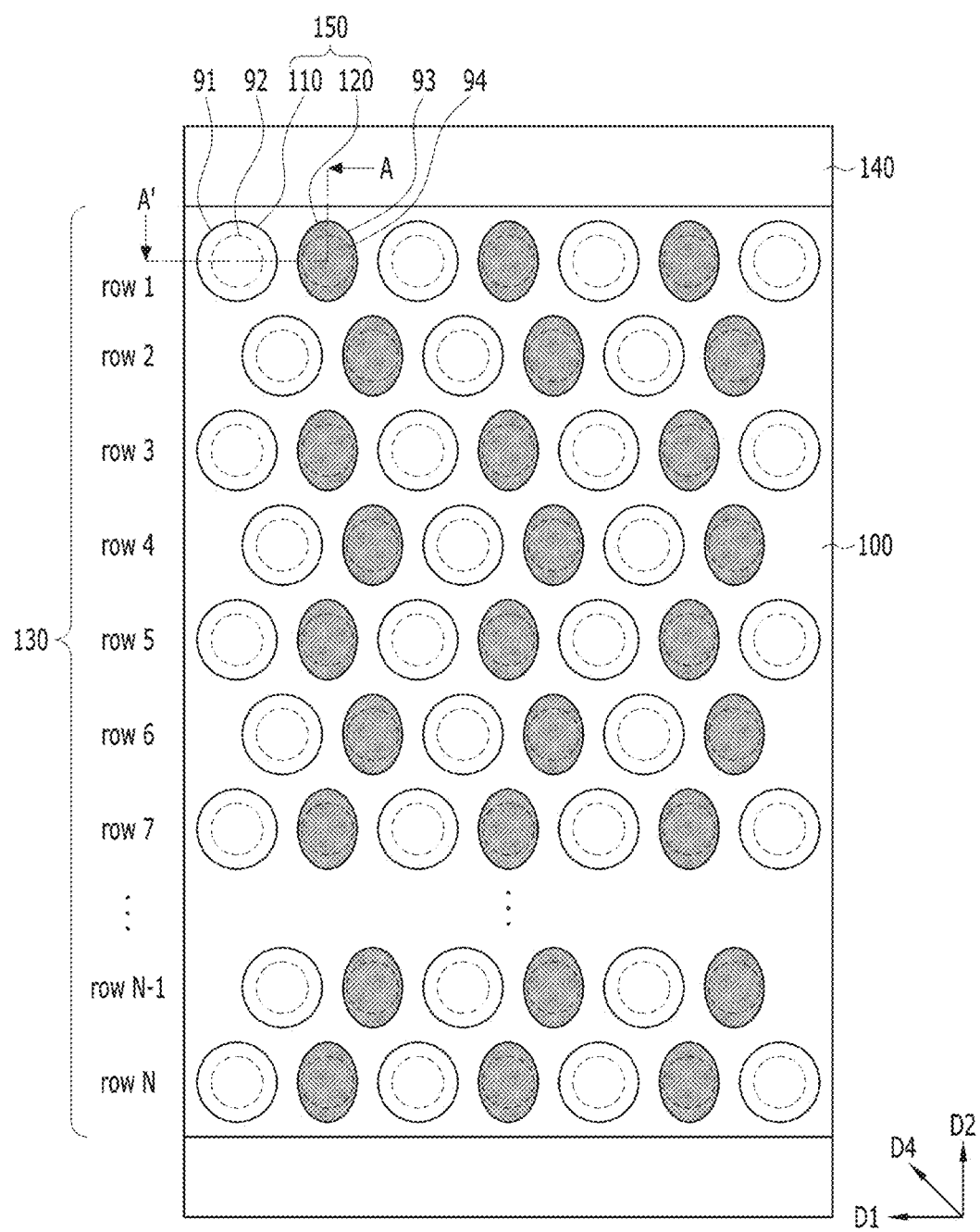
FIG. 4 is a plan view illustrating a semiconductor memory device in accordance with a first embodiment of the present disclosure.
Figure 5:
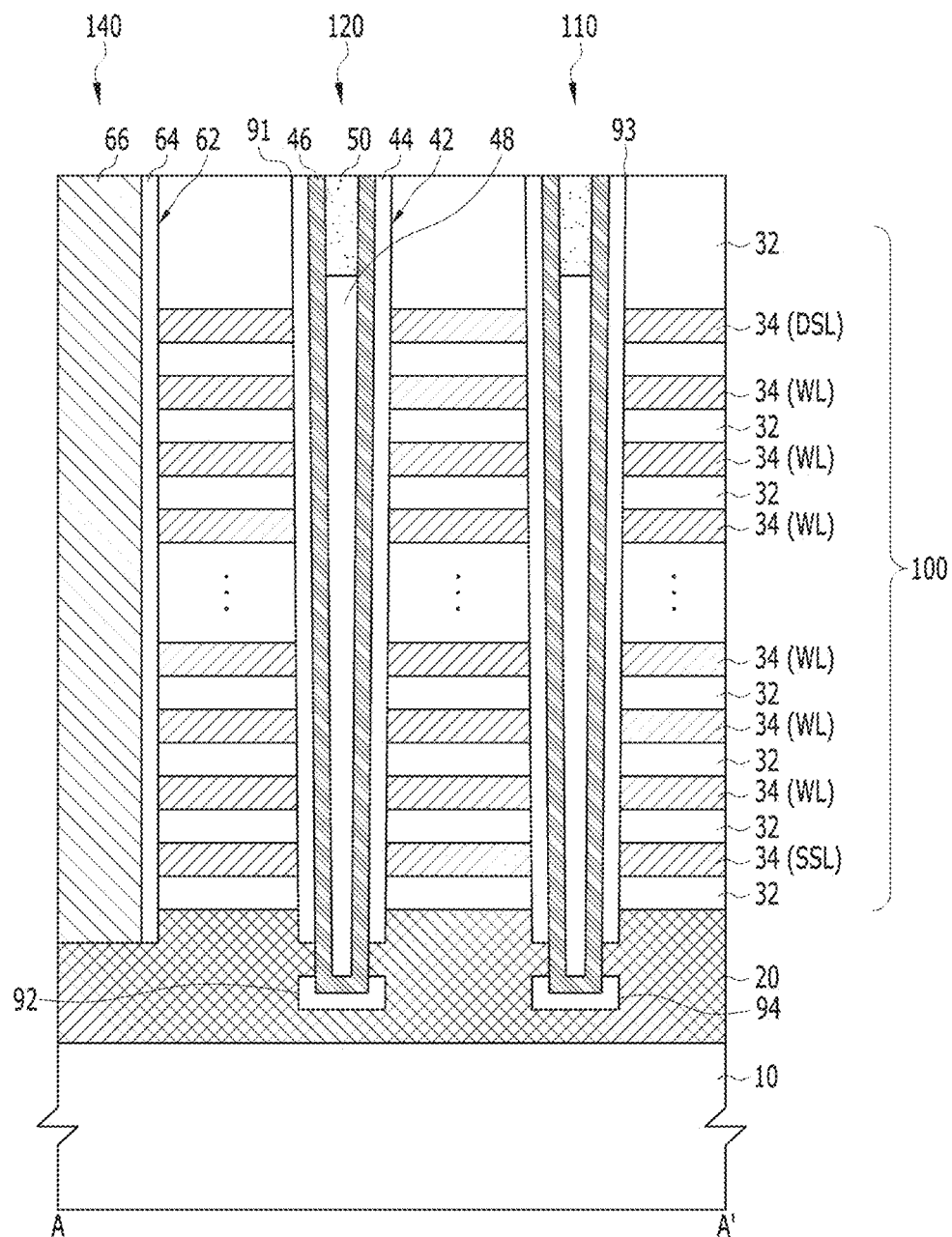
FIG. 5 is a cross-sectional view of the semiconductor memory device in accordance with the first embodiment of the present disclosure, which is taken along line A-A' illustrated in FIG. 4.

FIG. 4 is a plan view illustrating a semiconductor memory device in accordance with a first embodiment of the present disclosure, and FIG. 5 is a cross-sectional view of the semiconductor memory device in accordance with the first embodiment of the present disclosure, which is taken along line A-A' illustrated in FIG. 4.

As illustrated in FIG. 4 and FIG. 5, the semiconductor memory device in accordance with the first embodiment may include an electrode structure 100, which includes a plurality of gate conductive films 34 stacked on a substrate 10, and a channel array 130 in which a plurality of channel columns 150 passing through the electrode structure 100 are arranged in a zigzag manner in the second direction D2. The plurality of channel columns 150 may include a first column 110 whose uppermost plane 91 has a first shape and a second column 120 whose uppermost plane 93 has a second shape. Furthermore, the channel array 130 may refer to a two-dimensional arrangement of the channel columns 150 corresponding to one memory block.

The electrode structure 100 may have a structure in which an interlayer dielectric film 32 and the gate conductive film 34 are alternately stacked a plurality of times in the third direction D3, and the interlayer dielectric film 32 may be located on the lowermost layer and the uppermost layer of the electrode structure 100. Among the plurality of gate conductive films 34 stacked on the substrate 10, the gate conductive film 34 located on the lowermost layer may serve as a gate of the source select transistor (SST) or the source select line SSL, and the gate conductive film 34 located on the uppermost layer may serve as a gate of the drain select transistor (DST) or the drain select line DSL. Furthermore, the gate conductive films 34 located between the gate of the source select transistor (SST) and the gate of the drain select transistor (DST) may serve as a gate of the memory cell transistor or the word line WL.

A source line film 20 may be located between the substrate 10 and the electrode structure 100, and the plurality of channel columns 150 may pass through the electrode structure 100 and some of each of the channel columns 150 may be extended to the inside of the source line film 20. Furthermore, a line-type slit structure 140 extended in the first direction D1 may be located on each side of the channel array 130 in the second direction D2. The slit structure 140 may serve to separate the plurality of memory blocks. The slit structure 140 may include a slit trench 62 partially extended to the inside of the source line film 20 by passing through the electrode structure 100, a spacer 64 formed on the sidewall of the slit trench 62, and a conductive film 66 that gap-fills the inside of the slit trench 62. The conductive film 66 that gap-fills the inside of the slit trench 62 may be electrically connected to the source line film 20 and serve as the common source line (CSL).

Each of the plurality of channel columns 150 may include an open part 42, which is partially extended to the inside of the source line film 20 by passing through the electrode structure 100; a memory film 44, which is formed on the surface of the open part 42 to contact with the plurality of gate conductive films 34; a channel film 46, which is formed on the memory film 44; a core film 48, which is formed on the channel film 46 to partially gap-fill the open part 42; and a capping film 50, which is formed on the core film 48 to gap-fill the remaining open part 42. As will be described below, in the plurality of channel columns 150, the uppermost planes 91, 93 of the upper end portions of the open parts 42 may have first and second shapes (e.g., circular or elliptical) which are different from each other, but the plane shapes of the lowermost planes 92, 94 of the open parts 42 may be substantially the same as each other, for example, a circular shape. This is for minimizing a difference in characteristics among the plurality of memory cell transistors in the memory block. The open part 42 may have an inclined sidewall because it has a high aspect ratio. The memory film 44 may be a stacked film in which a tunnel insulating film (not illustrated), a charge trap film (not illustrated), and a blocking film (not illustrated) are sequentially stacked. The tunnel insulating film and the blocking film may include oxide, and the charge trap film may include nitride. The channel film 46 may include a semiconductor material, for example, polysilicon and may be electrically connected to the source line film 20. The core film 48 may include an insulating material. Furthermore, the capping film 50 may include a semiconductor material, for example, polysilicon and may be electrically connected to the channel film 46.

In the channel array 130, the plane centers of the plurality of channel columns 150 may be aligned on substantially the same line in the first direction D1, and N (N is a natural number equal to or more than 1) first columns 110 and N second columns 120 may be alternately arranged in the first direction D1. Intervals between the first columns 110 and the second columns 120 in the first direction D1 may be substantially the same. The first embodiment illustrates a case where one first column 110 and one second column 120 are alternately arranged in the first direction D1, that is, the N value is 1.

In the channel array 130, the plane centers of the plurality of channel columns 150 may be arranged in a zigzag manner in the second direction D2. In such a case, among the plurality of channel columns 150, the plane centers of the channel columns 150 located in odd-numbered rows (row 1, row 3, and row 5) may be aligned with each other on substantially the same line in the second direction D2, and the plane centers of the channel columns 150 located in even-numbered rows (row 2, row 4, and row 6) may be aligned with each other on substantially the same line in the second direction D2.

In the channel array 130, the plane centers of the plurality of channel columns 150 may be aligned on substantially the same line in the fourth direction D4, and 2N first columns 110 and 2N second columns 120 may be alternately arranged in the fourth direction D4. The first embodiment illustrates a case where a pair of first columns 110 and a pair of second columns 120 are alternately arranged in the fourth direction D4, that is, the N value is 1. In this embodiment, the plane centers of the of the channel columns 150 of the odd-numbered rows is offset from the plane centers of the channel columns 150 of the even-numbered rows, thus creating the zigzag manner.

The first shape and the second shape are the shapes of the uppermost planes 91, 93 of the first column 110 and the second column 120, respectively, and the first shape may be a circular shape and the second shape may be an elliptical shape having a major (long) axis and a minor (short) axis. The long axis of the second shape may be extended in the second direction D2 and may be substantially the same as or larger than the diameter of the first shape. The short axis of the second shape may be extended in the first direction D1 and may be smaller than the diameter of the first shape. When the long axis of the second shape is larger than the diameter of the first shape and the short axis of the second shape is smaller than the diameter of the first shape, the length of the long axis and the length of the short axis of the second shape may be adjusted such that the outermost circumference of the second shape is substantially the same as the outermost circumference of the first shape. That is, the outermost circumference of the first shape and the outermost circumference of the second shape may be equivalent to each other. Here, forming the outermost circumference of the first shape and the outermost circumference of the second shape to be equivalent to each other is for substantially preventing the occurrence of a difference in characteristics between a plurality of memory cell transistors sharing the first column 110 and a plurality of memory cell transistors sharing the second column 120.

Meanwhile, the shapes of the uppermost planes 91, 93 of the first column 110 and the second column 120 are different from each other, but the lowermost planes 92, 94 of the first column 110 and the second column 120 may have a third shape (see the dotted lines of FIG. 4) substantially the same as the first shape. Specifically, the shape of the lowermost planes 92, 94 of the first column 110 and the second column 120 may be a circular shape and the diameter of the shape of the lowermost planes may be substantially the same as or smaller than the length of the short axis of the second shape. Accordingly, the first column 110 may have a structure in which the uppermost plane 91 has a first shape (that is, a circular shape) and the lowermost plane 92 of the first column has a third shape (that is, a circular shape) that are substantially the same as the first shape, but the diameter is gradually reduced from the uppermost plane 91 to the lowermost plane 92. On the other hand, the second column 120 may have a structure in which the uppermost plane 93 has a second shape (that is, an elliptical shape) and the lowermost plane 94 of the second column has the third shape (that is, a circular shape) that are different from the second shape and the length of the long axis and the length of the short axis of the second shape are gradually reduced from the uppermost plane 93 to the lowermost plane 94, but the length of the long axis is reduced more than the length of the short axis.

As described above, in the semiconductor memory device in accordance with the first embodiment, the plurality of channel columns 150 include the first column 110 and the second column 120 which have different uppermost plane shapes, and N first columns 110 and N second columns 120 are alternately arranged in the first direction D1 in the channel array 130, so that it is possible to reduce the size of the memory block. Particularly, it is possible to reduce the width of the memory block in the first direction D1, so that it is possible to reduce a chip size and to solve a package fit-in issue by changing the form factor for the package.

In a semiconductor memory device having a three-dimensional structure introduced in order to increase the degree of integration of a semiconductor memory device, an occupation area of a row decoder (X-DEC) for driving a memory cell array continuously increases in proportion to an increase in the number of stacks of the word lines WL in the memory cell array or the electrode structure 100. Therefore, even in a peri under cell (PUC) structure in which a peripheral circuit, including the row decoder, is arranged below the memory cell array, an area of the row decoder is larger than an occupation area of a stepped contact region for connecting the memory cell array and the peripheral circuit, which serves as a factor of inhibiting reduction in chip size. Particularly, the row decoder has a bar type shape having a long axis extended in the first direction D1 due to a contact connection relation with the memory cell array, thereby causing the package fit-in problem.

Figure 6A:
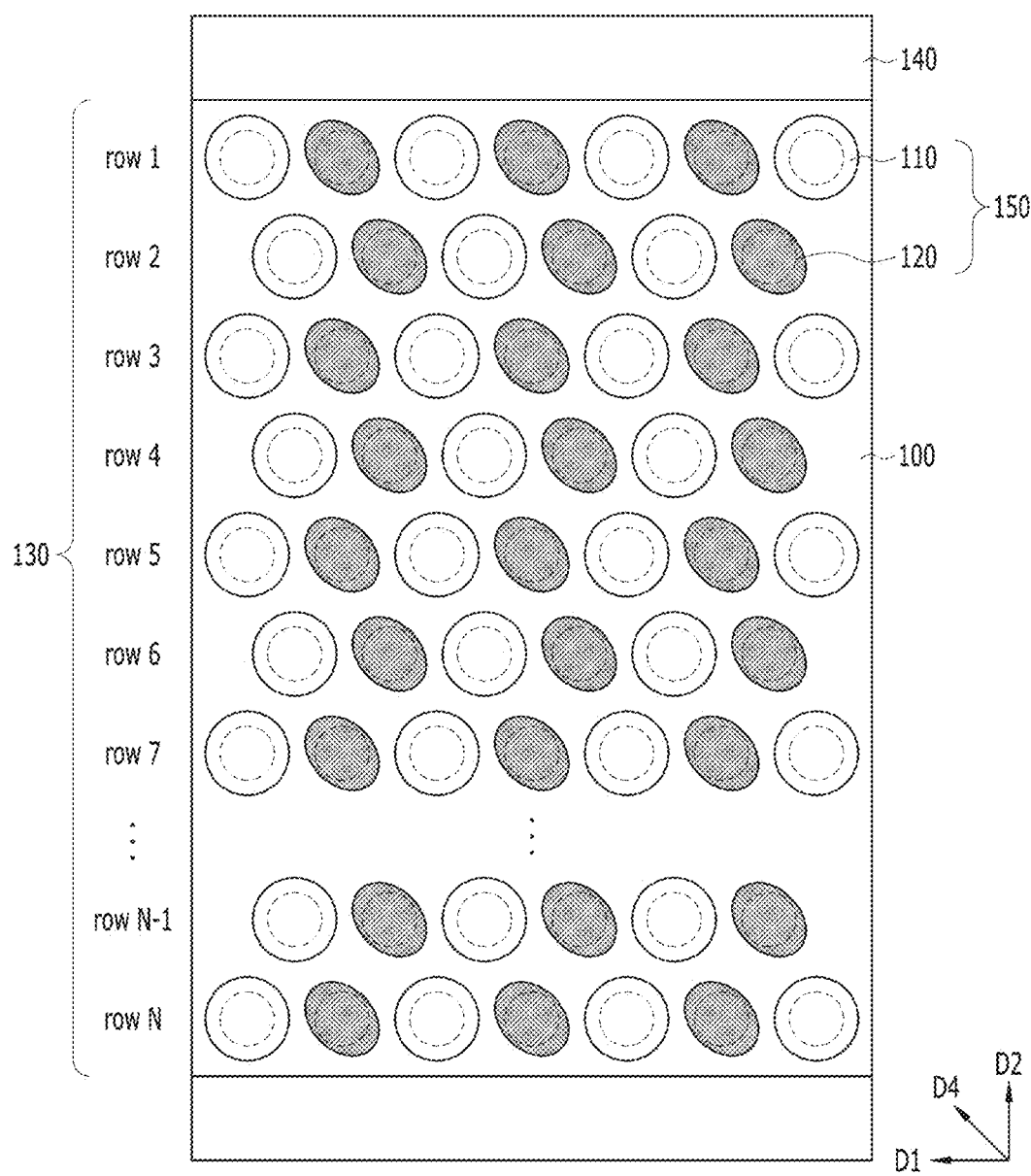
FIG. 6A and FIG. 6B are plan views illustrating modified examples of the semiconductor memory device in accordance with the first embodiment of the present disclosure.
Figure 6B:
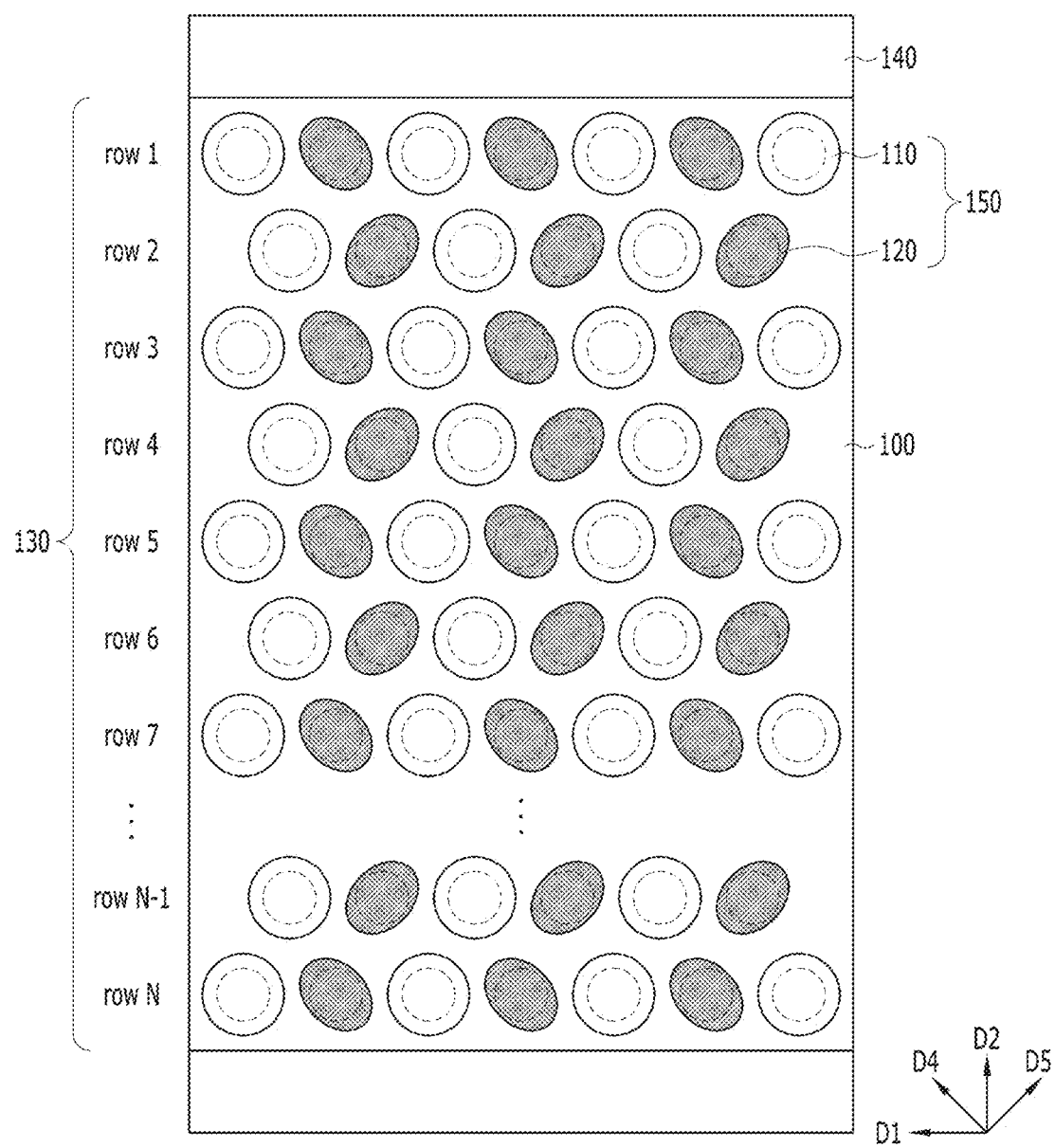

FIG. 6A and FIG. 6B are plan views illustrating modified examples of the semiconductor memory device in accordance with the first embodiment of the present disclosure.

As illustrated in FIG. 6A and FIG. 6B, in the semiconductor memory device in accordance with the modified examples of the first embodiment, the first shape and the second shape are the uppermost plane shapes of the first column 110 and the second column 120, respectively, and the first shape may be a circular shape and the second shape may be an elliptical shape having a long axis and a short axis.

Referring to FIG. 6A, the long axis of the second shape may be extended in the fourth direction D4 and may be substantially the same as or larger than the diameter of the first shape. That is, in the channel array 130, all the second columns 120 each having the second shape may each have a shape in which the long axis is extended in the fourth direction D4.

On the other hand, referring to FIG. 6B, the uppermost planes of the second columns 120 located in odd-numbered rows (row 1, row 3, and row 5) in the second direction D2 may each have the second shape in which the long axis is extended in the fourth direction D4, and the uppermost planes of the second columns 120 located in even-numbered rows (row 2, row 4, and row 6) in the second direction D2 may each have the second shape in which the long axis is extended in the fifth direction D5 crossing the fourth direction D4. For some embodiments, crossing directions represent different directions.

Here, the long axis of the second shape is extended in the fourth direction D4 or the fifth direction D5, so that it is possible to more readily increase the length of the long axis of the second shape than in the first embodiment. Accordingly, it is possible to more readily allow the outermost circumference of the first shape to be substantially the same as the outermost circumference of the second shape than in the first embodiment.

As described above, in the semiconductor memory device in accordance with the modified examples of the first embodiment, the plurality of channel columns 150 include the first column 110 and the second column 120 which have different uppermost plane shapes, and N first columns 110 and N second columns 120 are alternately arranged in the first direction D1 in the channel array 130, so that it is possible to reduce the size of the memory block. Particularly, it is possible to reduce the width of the memory block in the first direction D1, so that it is possible to reduce a chip size and to solve the package fit-in issue.

Furthermore, the second shape is an elliptical shape having a long axis and a short axis, and the long axis of the second shape is extended in the fourth direction D4 or the fifth direction D5, so that it is possible to substantially and effectively prevent the occurrence of a difference in characteristics between a plurality of memory cell transistors sharing the first column 110 and a plurality of memory cell transistors sharing the second column 120.

Figure 7:
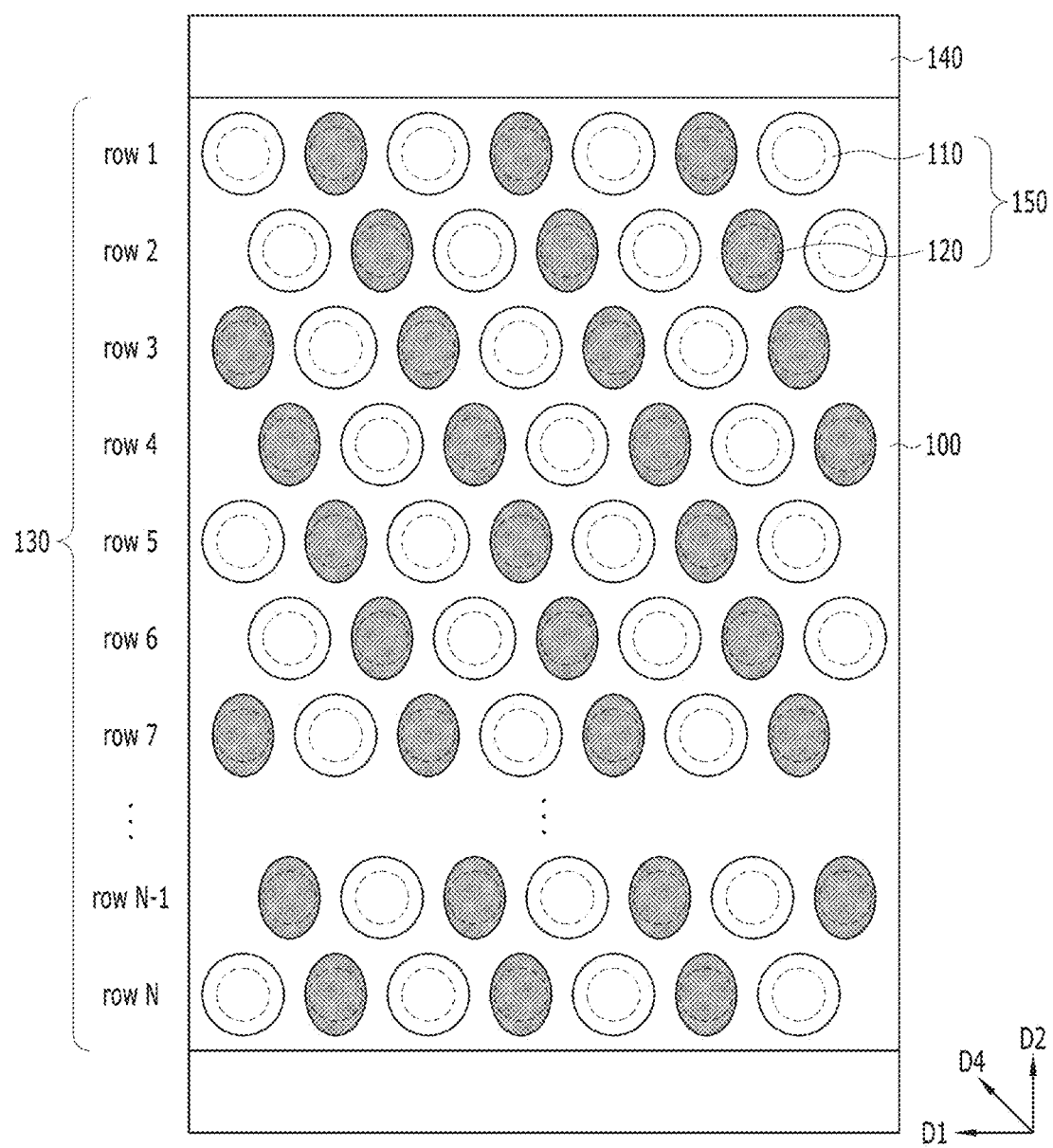
FIG. 7 is a plan view illustrating a semiconductor memory device in accordance with a second embodiment of the present disclosure.

FIG. 7 is a plan view illustrating a semiconductor memory device in accordance with a second embodiment of the present disclosure. Hereinafter, for convenience of description, the same elements as those of the first embodiment are denoted by the same reference numerals and a detailed description thereof will be omitted.

As illustrated in FIG. 7, the semiconductor memory device in accordance with the second embodiment may include an electrode structure 100, which includes a plurality of gate conductive films 34 stacked on a substrate 10, and a channel array 130 in which a plurality of channel columns 150 passing through the electrode structure 100 are arranged in a zigzag manner in the second direction D2. The plurality of channel columns 150 may include a first column 110 whose uppermost plane has a first shape and a second column 120 whose uppermost plane has a second shape.

In the channel array 130, the plane centers of the plurality of channel columns 150 may be aligned on substantially the same line in the first direction D1, and N (N is a natural number equal to or more than 1) first columns 110 and N second columns 120 may be alternately arranged in the first direction D1. The second embodiment illustrates a case where one first column 110 and one second column 120 are alternately arranged in the first direction D1, that is, the N value is 1.

In the channel array 130, the plane centers of the plurality of channel columns 150 may be arranged in a zigzag manner in the second direction D2.

In the channel array 130, the plane centers of the plurality of channel columns 150 may be aligned on substantially the same line in the fourth direction D4, and the channel columns 150 each having substantially the same uppermost plane shape may be arranged in the fourth direction D4.

The first shape and the second shape are the uppermost plane shapes of the first column 110 and the second column 120, respectively, and the first shape may be a circular shape and the second shape may be an elliptical shape having a long axis and a short axis. The long axis of the second shape may be extended in the second direction D2 and may be substantially the same as or larger than the diameter of the first shape. The short axis of the second shape may be extended in the first direction D1 and may be smaller than the diameter of the first shape. When the long axis of the second shape is larger than the diameter of the first shape and the short axis of the second shape is smaller than the diameter of the first shape, the length of the long axis and the length of the short axis of the second shape may be adjusted such that the outermost circumference of the second shape is substantially the same as the outermost circumference of the first shape. That is, the outermost circumference of the first shape and the outermost circumference of the second shape may be equivalent to each other. Here, forming the outermost circumference of the first shape and the outermost circumference of the second shape to be equivalent to each other is for substantially preventing the occurrence of a difference in characteristics between a plurality of memory cell transistors sharing the first column 110 and a plurality of memory cell transistors sharing the second column 120.

Meanwhile, the uppermost plane shapes of the first column 110 and the second column 120 are different from each other, but the lowermost planes of the first column 110 and the second column 120 may have a third shape (see the dotted line of FIG. 7) substantially the same as the first shape. Specifically, each of the lowermost plane shapes of the first column 110 and the second column 120 may be a circular shape and the diameter of the lowermost plane shape may be substantially the same as or smaller than the length of the short axis of the second shape. Accordingly, the first column 110 may have a structure in which the uppermost plane shape (that is, a circular shape) and the lowermost plane shape (that is, a circular shape) are substantially the same as each other, but the diameter is gradually reduced from the top to the bottom. On the other hand, the second column 120 may have a structure in which the uppermost plane shape (that is, an elliptical shape) and the lowermost plane shape (that is, a circular shape) are different from each other and the length of the long axis and the length of the short axis are gradually reduced from the top to the bottom, but the length of the long axis is reduced more than the length of the short axis.

As described above, in the semiconductor memory device in accordance with the second embodiment, the plurality of channel columns 150 include the first column 110 and the second column 120 which have different uppermost plane shapes, and N first columns 110 and N second columns 120 are alternately arranged in the first direction D1 in the channel array 130, so that it is possible to reduce the size of the memory block. Particularly, it is possible to reduce the width of the memory block in the first direction D1, so that it is possible to reduce a chip size and to solve the package fit-in issue.

Meanwhile, as described above with reference to FIG. 6A and FIG. 6B, in the modified examples of the semiconductor memory device in accordance with the second embodiment, the uppermost plane shape of the second column 120, that is, the second shape is an elliptical shape having a long axis and a short axis, and the long axis of the second shape may be extended in the fourth direction D4 or the fifth direction D5 and may be substantially the same as or larger than the diameter of the first shape.

Figure 8:
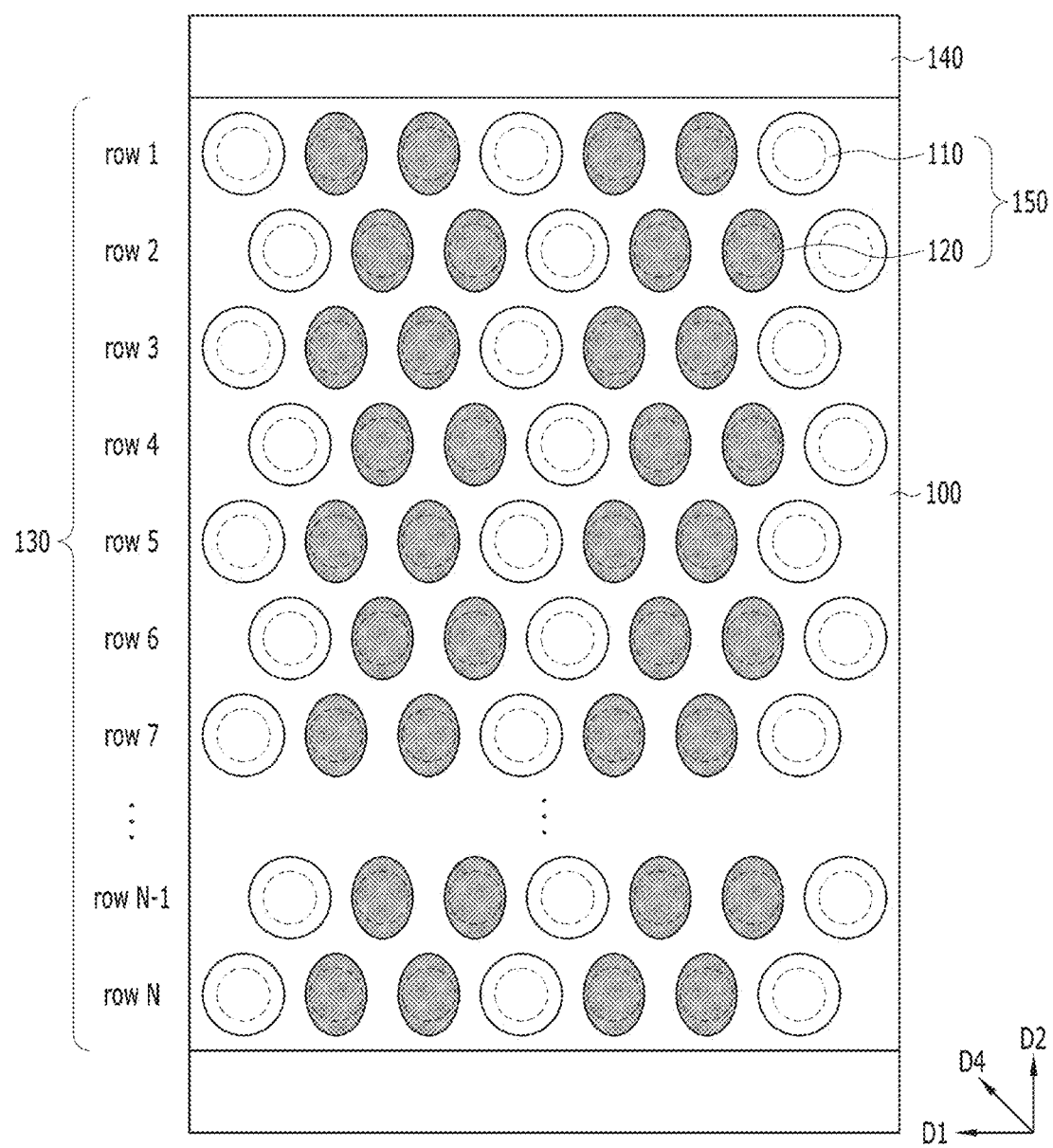
FIG. 8 is a plan view illustrating a semiconductor memory device in accordance with a third embodiment of the present disclosure.

FIG. 8 is a plan view illustrating a semiconductor memory device in accordance with a third embodiment of the present disclosure. Hereinafter, for convenience of description, the same elements as those of the first embodiment are denoted by the same reference numerals and a detailed description thereof will be omitted.

As illustrated in FIG. 8, the semiconductor memory device in accordance with the third embodiment may include an electrode structure 100, which includes a plurality of gate conductive films 34 stacked on a substrate 10, and a channel array 130 in which a plurality of channel columns 150 passing through the electrode structure 100 are arranged in a zigzag manner in the second direction D2. The plurality of channel columns 150 may include a first column 110 whose uppermost plane has a first shape and a second column 120 whose uppermost plane has a second shape.

In the channel array 130, the plane centers of the plurality of channel columns 150 may be aligned on substantially the same line in the first direction D1, and N (N is a natural number equal to or more than 1) first columns 110 and M (M is a natural number equal to or more than 2) second columns 120 may be alternately arranged in the first direction D1. The third embodiment illustrates a case where one first column 110 and two second columns 120 are alternately arranged in the first direction D1, that is, the N value is 1 and the M value is 2.

In the channel array 130, the plane centers of the plurality of channel columns 150 may be arranged in a zigzag manner in the second direction D2. In such a case, among the plurality of channel columns 150, the plane centers of the channel columns 150 located in odd-numbered rows (row 1, row 3, and row 5) may be aligned with each other on substantially the same line in the second direction D2 and the plane centers of the channel columns 150 located in even-numbered rows (row 2, row 4, and row 6) may be aligned with each other on substantially the same line in the second direction D2. In this embodiment, the plane centers of the of the channel columns 150 of the odd-numbered rows is offset from the plane centers of the channel columns 150 of the even-numbered rows, thus creating the zigzag manner.

In the channel array 130, the plane centers of the plurality of channel columns 150 may be aligned on substantially the same line in the fourth direction D4, and 2N first columns 110 and 2M second columns 120 may be alternately arranged in the fourth direction D4. The third embodiment illustrates a case where two first columns 110 and four second columns 120 are alternately arranged in the fourth direction D4, that is, the N value is 1 and the M value is 2.

The first shape and the second shape are the uppermost plane shapes of the first column 110 and the second column 120, respectively, and the first shape may be a circular shape and the second shape may be an elliptical shape having a long axis and a short axis. The long axis of the second shape may be extended in the second direction D2 and may be substantially the same as or larger than the diameter of the first shape. The short axis of the second shape may be extended in the first direction D1 and may be smaller than the diameter of the first shape. When the long axis of the second shape is larger than the diameter of the first shape and the short axis of the second shape is smaller than the diameter of the first shape, the length of the long axis and the length of the short axis of the second shape may be adjusted such that the outermost circumference of the second shape is substantially the same as the outermost circumference of the first shape. That is, the outermost circumference of the first shape and the outermost circumference of the second shape may be equivalent to each other. Here, forming the outermost circumference of the first shape and the outermost circumference of the second shape to be equivalent to each other is for substantially preventing the occurrence of a difference in characteristics between a plurality of memory cell transistors sharing the first column 110 and a plurality of memory cell transistors sharing the second column 120.

Meanwhile, the uppermost plane shapes of the first column 110 and the second column 120 are different from each other, but the lowermost planes of the first column 110 and the second column 120 may have a third shape (see the dotted line of FIG. 8) substantially the same as the first shape. Specifically, each of the lowermost plane shapes of the first column 110 and the second column 120 may be a circular shape and the diameter of the lowermost plane shape may be substantially the same as or smaller than the length of the short axis of the second shape. Accordingly, the first column 110 may have a structure in which the uppermost plane shape (that is, a circular shape) and the lowermost plane shape (that is, a circular shape) are substantially the same as each other, but the diameter is gradually reduced from the top to the bottom. On the other hand, the second column 120 may have a structure in which the uppermost plane shape (that is, an elliptical shape) and the lowermost plane shape (that is, a circular shape) are different from each other and the length of the long axis and the length of the short axis are gradually reduced from the top to the bottom, but the length of the long axis is reduced more than the length of the short axis.

As described above, in the semiconductor memory device in accordance with the third embodiment, the plurality of channel columns 150 include the first column 110 and the second column 120 which have different uppermost plane shapes, and N first columns 110 and M second columns 120 are alternately arranged in the first direction D1 in the channel array 130, so that it is possible to reduce the size of the memory block. Particularly, it is possible to reduce the width of the memory block in the first direction D1, so that it is possible to reduce a chip size and to solve the package fit-in issue.

Meanwhile, as described above with reference to FIG. 6A and FIG. 6B, in the modified examples of the semiconductor memory device in accordance with the third embodiment, the uppermost plane shape of the second column 120, that is, the second shape is an elliptical shape having a long axis and a short axis, and the long axis of the second shape may be extended in the fourth direction D4 or the fifth direction D5 and may be substantially the same as or larger than the diameter of the first shape.

Figure 9:
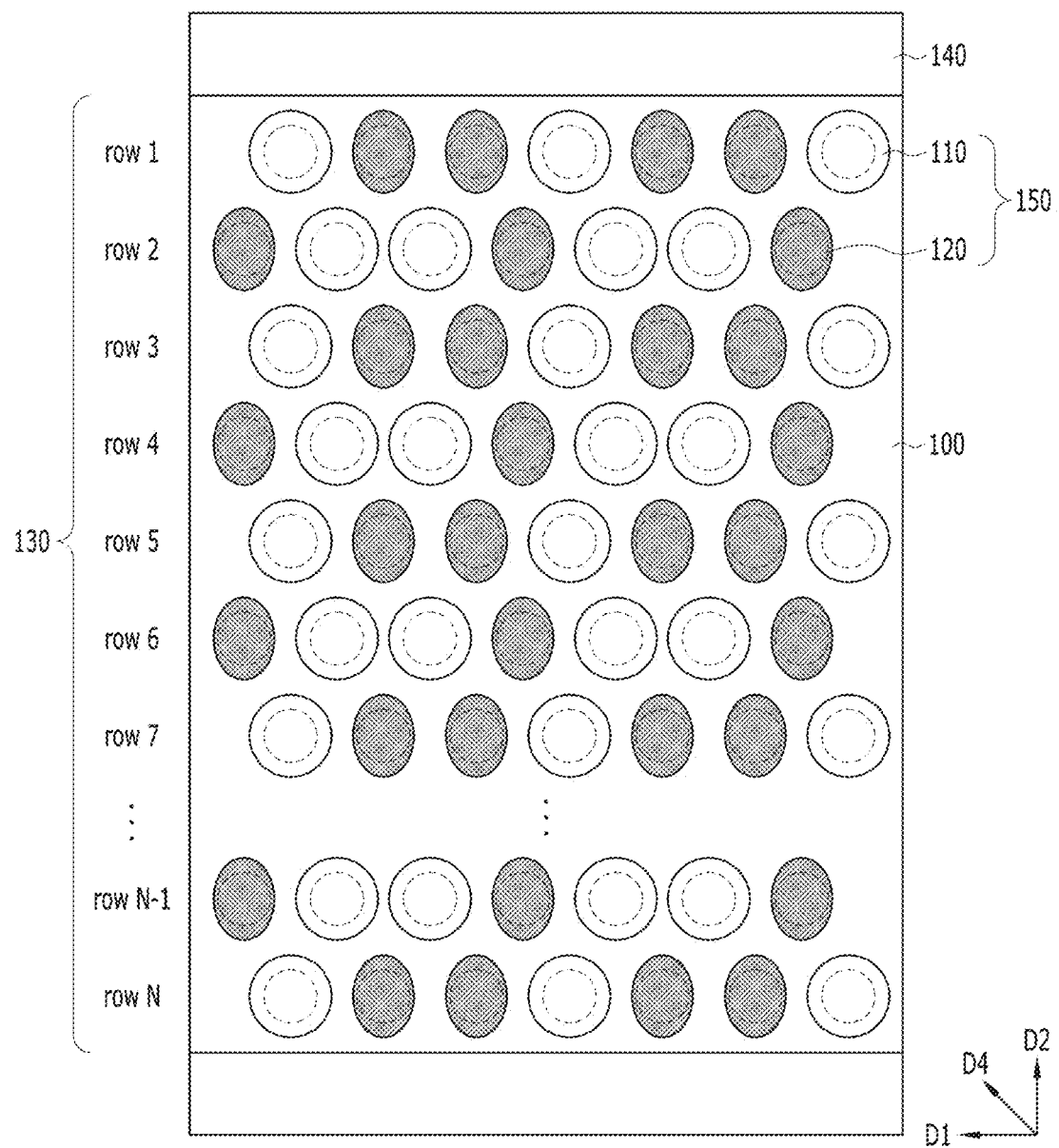
FIG. 9 is a plan view illustrating a semiconductor memory device in accordance with a fourth embodiment of the present disclosure.

FIG. 9 is a plan view illustrating a semiconductor memory device in accordance with a fourth embodiment of the present disclosure. Hereinafter, for convenience of description, the same elements as those of the first embodiment are denoted by the same reference numerals and a detailed description thereof will be omitted.

As illustrated in FIG. 9, the semiconductor memory device in accordance with the fourth embodiment may include an electrode structure 100, which includes a plurality of gate conductive films 34 stacked on a substrate 10, and a channel array 130 in which a plurality of channel columns 150 passing through the electrode structure 100 are arranged in a zigzag manner in the second direction D2. The plurality of channel columns 150 may include a first column 110 whose uppermost plane has a first shape and a second column 120 whose uppermost plane has a second shape.

In the channel array 130, the plane centers of the plurality of channel columns 150 may be aligned on substantially the same line in the first direction D1. In such a case, in odd-numbered rows (row 1, row 3, and row 5), N (N is a natural number equal to or more than 1) first columns 110 and M (M is a natural number equal to or more than 2) second columns 120 may be alternately arranged in the first direction D1. On the other hand, in even-numbered rows (row 2, row 4, and row 6), M first columns 110 and N second columns 120 may be alternately arranged in the first direction D1. The fourth embodiment illustrates a case where one first column 110 and two second columns 120 are alternately arranged in the odd-numbered rows (row 1, row 3, and row 5) and two first columns 110 and one second column 120 are alternately arranged in the even-numbered rows (row 2, row 4, and row 6). The fourth embodiment illustrates a case where the N value is 1 and the M value is 2.

In the channel array 130, the plane centers of the plurality of channel columns 150 may be arranged in a zigzag manner in the second direction D2. In such a case, among the plurality of channel columns 150, the plane centers of the channel columns 150 located in odd-numbered rows (row 1, row 3, and row 5) may be aligned with each other on substantially the same line in the second direction D2 and the plane centers of the channel columns 150 located in even-numbered rows (row 2, row 4, and row 6) may be aligned with each other on substantially the same line in the second direction D2. In this embodiment, the plane centers of the of the channel columns 150 of the odd-numbered rows is offset from the plane centers of the channel columns 150 of the even-numbered rows, thus creating the zigzag manner.

In the channel array 130, the plane centers of the plurality of channel columns 150 may be aligned on substantially the same line in the fourth direction D4.

The first shape and the second shape are the uppermost plane shapes of the first column 110 and the second column 120, respectively, and the first shape may be a circular shape and the second shape may be an elliptical shape having a long axis and a short axis. The long axis of the second shape may be extended in the second direction D2 and may be substantially the same as or larger than the diameter of the first shape. The short axis of the second shape may be extended in the first direction D1 and may be smaller than the diameter of the first shape. When the long axis of the second shape is larger than the diameter of the first shape and the short axis of the second shape is smaller than the diameter of the first shape, the length of the long axis and the length of the short axis of the second shape may be adjusted such that the outermost circumference of the second shape is substantially the same as the outermost circumference of the first shape. That is, the outermost circumference of the first shape and the outermost circumference of the second shape may be equivalent to each other. Here, forming the outermost circumference of the first shape and the outermost circumference of the second shape to be equivalent to each other is for substantially preventing the occurrence of a difference in characteristics between a plurality of memory cell transistors sharing the first column 110 and a plurality of memory cell transistors sharing the second column 120.

Meanwhile, the uppermost plane shapes of the first column 110 and the second column 120 are different from each other, but the lowermost planes of the first column 110 and the second column 120 may have a third shape (see the dotted line of FIG. 9) substantially the same as the first shape. Specifically, each of the lowermost plane shapes of the first column 110 and the second column 120 may be a circular shape and the diameter of the lowermost plane shape may be substantially the same as or smaller than the length of the short axis of the second shape. Accordingly, the first column 110 may have a structure in which the uppermost plane shape (that is, a circular shape) and the lowermost plane shape (that is, a circular shape) are substantially the same, but the diameter is gradually reduced from the top to the bottom. On the other hand, the second column 120 may have a structure in which the uppermost plane shape (that is, an elliptical shape) and the lowermost plane shape (that is, a circular shape) are different from each other and the length of the long axis and the length of the short axis are gradually reduced from the top to the bottom, but the length of the long axis is reduced more than the length of the short axis.

As described above, in the semiconductor memory device in accordance with the fourth embodiment, the plurality of channel columns 150 include the first column 110 and the second column 120 which have different uppermost plane shapes, and N first columns 110 and M second columns 120 are alternately arranged in the odd-numbered rows (row1, row3, and rows) in the first direction D1 and M first columns 110 and N second columns 120 are alternately arranged in the even-numbered rows (row2, row4, and row6) in the first direction D1, so that it is possible to reduce the size of the memory block. Particularly, it is possible to reduce the width of the memory block in the first direction D1, so that it is possible to reduce a chip size and to solve the package fit-in issue.

Meanwhile, as described above with reference to FIG. 6A and FIG. 6B, in the modified examples of the semiconductor memory device in accordance with the fourth embodiment, the uppermost plane shape of the second column 120, that is, the second shape is an elliptical shape having a long axis and a short axis, and the long axis of the second shape may be extended in the fourth direction D4 or the fifth direction D5 and may be substantially the same as or larger than the diameter of the first shape.

Figure 10:
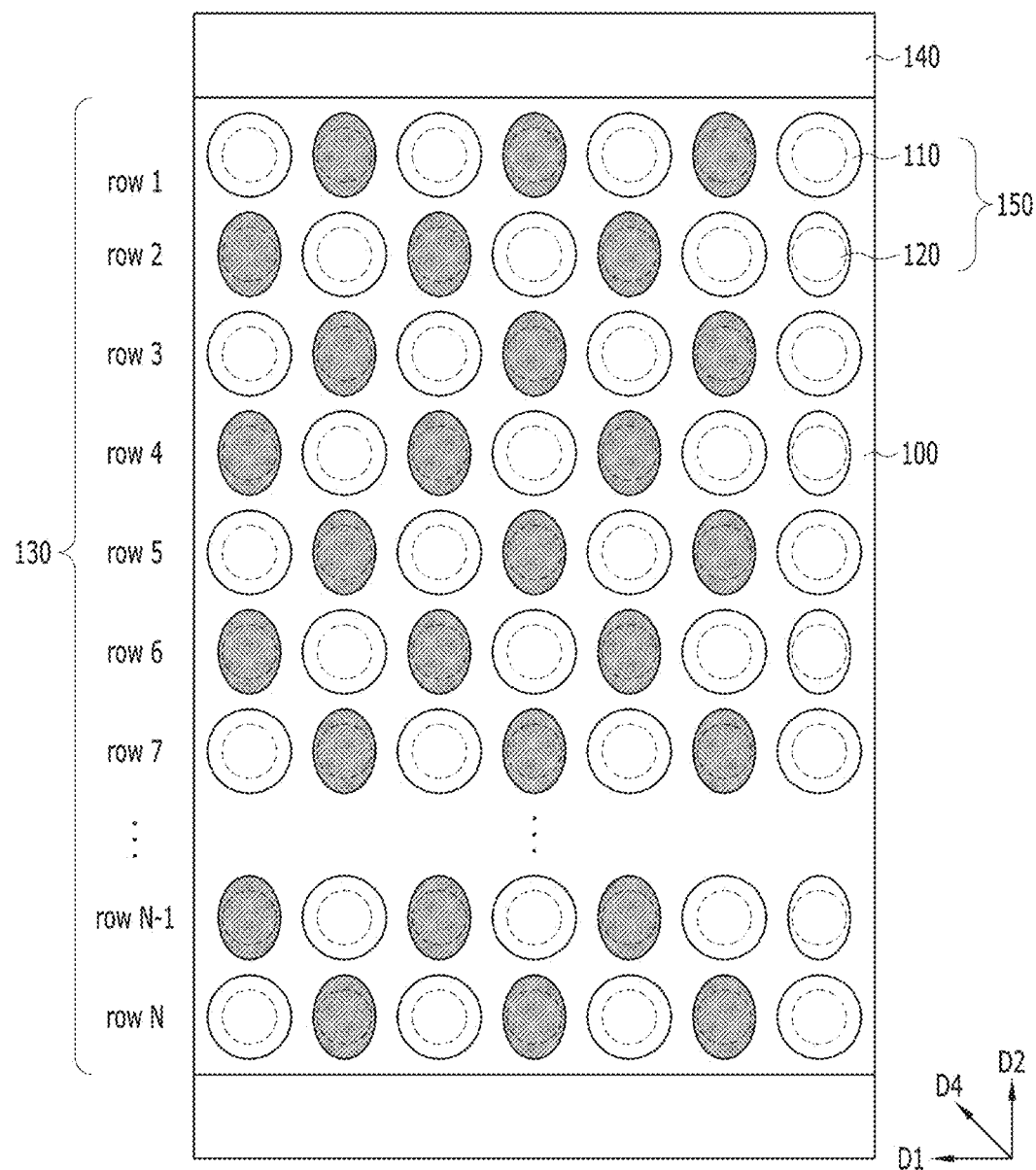
FIG. 10 is a plan view illustrating a semiconductor memory device in accordance with a fifth embodiment of the present disclosure.

FIG. 10 is a plan view illustrating a semiconductor memory device in accordance with a fifth embodiment of the present disclosure. Hereinafter, for convenience of description, the same elements as those of the first embodiment are denoted by the same reference numerals and a detailed description thereof will be omitted.

As illustrated in FIG. 10, the semiconductor memory device in accordance with the fifth embodiment may include an electrode structure 100, which includes a plurality of gate conductive films 34 stacked on a substrate 10, and a channel array 130 in which a plurality of channel columns 150 passing through the electrode structure 100 are arranged in a checkerboard form. The plurality of channel columns 150 may include a first column 110 whose uppermost plane has a first shape and a second column 120 whose uppermost plane has a second shape.

In the channel array 130, the plane centers of the plurality of channel columns 150 may be aligned on substantially the same line in the first direction D1, and N (N is a natural number equal to or more than 1) first columns 110 and N second columns 120 may be alternately arranged in the first direction D1. The fifth embodiment illustrates a case where one first column 110 and one second column 120 are alternately arranged in the first direction D1, that is, the N value is 1.

In the channel array 130, the plane centers of the plurality of channel columns 150 may be aligned on substantially the same line in the second direction D2, and the N first columns 110 and the N second columns 120 may be alternately arranged in the second direction D2. The fifth embodiment illustrates a case where one first column 110 and one second column 120 are alternately arranged in the second direction D2, that is, the N value is 1.

In the channel array 130, the plane centers of the plurality of channel columns 150 may be aligned on substantially the same line in the fourth direction D4, and the channel columns 150 each having substantially the same uppermost plane shape may be arranged in the fourth direction D4.

The first shape and the second shape are the uppermost plane shapes of the first column 110 and the second column 120, respectively, and the first shape may be a circular shape and the second shape may be an elliptical shape having a long axis and a short axis. The long axis of the second shape may be extended in the second direction D2 and may be substantially the same as or larger than the diameter of the first shape. The short axis of the second shape may be extended in the first direction D1 and may be smaller than the diameter of the first shape. When the long axis of the second shape is larger than the diameter of the first shape and the short axis of the second shape is smaller than the diameter of the first shape, the length of the long axis and the length of the short axis of the second shape may be adjusted such that the outermost circumference of the second shape is substantially the same as the outermost circumference of the first shape. That is, the outermost circumference of the first shape and the outermost circumference of the second shape may be equivalent to each other. Here, forming the outermost circumference of the first shape and the outermost circumference of the second shape to be equivalent to each other is for substantially preventing the occurrence of a difference in characteristics between a plurality of memory cell transistors sharing the first column 110 and a plurality of memory cell transistors sharing the second column 120.

Meanwhile, the uppermost plane shapes of the first column 110 and the second column 120 are different from each other, but the lowermost planes of the first column 110 and the second column 120 may have a third shape (see the dotted line of FIG. 10) substantially the same as the first shape. Specifically, each of the lowermost plane shapes of the first column 110 and the second column 120 may be a circular shape and the diameter of the lowermost plane shape may be substantially the same as or smaller than the length of the short axis of the second shape. Accordingly, the first column 110 may have a structure in which the uppermost plane shape (that is, a circular shape) and the lowermost plane shape (that is, a circular shape) are substantially the same as each other, but the diameter is gradually reduced from the top to the bottom. On the other hand, the second column 120 may have a structure in which the uppermost plane shape (that is, an elliptical shape) and the lowermost plane shape (that is, a circular shape) are different from each other and the length of the long axis and the length of the short axis are gradually reduced from the top to the bottom, but the length of the long axis is reduced more than the length of the short axis.

As described above, in the semiconductor memory device in accordance with the fifth embodiment, the plurality of channel columns 150 include the first column 110 and the second column 120 which have different uppermost plane shapes, and N first columns 110 and N second columns 120 are alternately arranged in each of the first direction D1 and the second direction D2 in the channel array 130, so that it is possible to reduce the size of the memory block. Particularly, it is possible to arrange a larger number of channel columns 150 within substantially the same area and to reduce the width of the memory block in the first direction D1, so that it is possible to reduce a chip size and to solve a package fit-in issue.

Meanwhile, as described above with reference to FIG. 6A and FIG. 6B, in the modified examples of the semiconductor memory device in accordance with the fifth embodiment, the uppermost plane shape of the second column 120, that is, the second shape is an elliptical shape having a long axis and a short axis, and the long axis of the second shape may be extended in the fourth direction D4 or the fifth direction D5 and may be substantially the same as or larger than the diameter of the first shape.

Some embodiment of semiconductor devices in accordance with the present teachings may be fabricated, at least in part, through standard manufacturing processes.

Figure 11:
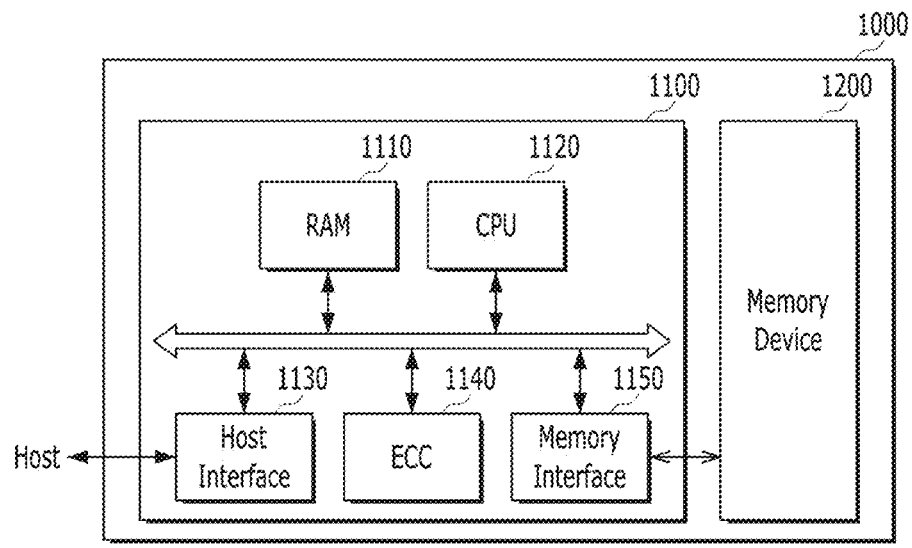
FIG. 11 is a block diagram of a configuration of a memory system according to an embodiment of the present disclosure.

FIG. 11 is a block diagram of a configuration of a memory system 1000 according to an embodiment of the present disclosure.

As illustrated in FIG. 11, the memory system 1000 may include a memory device 1200 and a controller 1100.

The memory device 1200 may be used to store various data types such as text, graphic and software code. The memory device 1200 may be a non-volatile memory. The memory device 1200 may be the semiconductor device described above with reference to FIGS. 4 to 10. In addition, the memory device 1200 may include an electrode structure including a plurality of gate conductive films stacked on a substrate; and a channel array in which a plurality of channel columns passing through the electrode structure are arranged in a second direction, wherein the plurality of channel columns may include a first column whose uppermost plane has a first shape and a second column whose uppermost plane has a second shape, and N (N is a natural number equal to more or than 1) first columns and N second columns are alternately arranged in a first direction crossing the second direction. In addition, the memory device 1200 may include an electrode structure including a plurality of gate conductive films stacked on a substrate; and a channel array in which a plurality of channel columns passing through the electrode structure are arranged in a zigzag manner in a second direction, wherein the plurality of channel columns includes a first column whose uppermost plane has a first shape and a second column whose uppermost plane has a second shape different from the first shape, and in any one row of the channel array, N (N is a natural number equal to or more than 1) first columns and M (M is a natural number equal to or more than 2) second columns are alternately arranged in a first direction crossing the second direction. Because the memory device 1200 is formed and manufactured in the above-described manner, a detailed description thereof will be omitted.

The controller 1100 may be couple to a host and the memory device 1200 and may access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The host interface 1130 may be interface with the host. For example, the controller 1100 may communicate with the host through one of various interface protocols including a Universal Serial Bus (USB) protocol, a multimedia card (MMC) protocol, a peripheral component interconnection (PCI) protocol, a PCI express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, and a private protocol.

The ECC circuit 1140 may detect and correct errors included in data read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data, externally transferred through the host interface 1130, or temporarily store data, transferred from the memory device 1200 through the memory interface 1150. In addition, the controller 1100 may further include ROM storing code data to interface with the host.

As described above, because the memory system 1000 according to an embodiment of the present disclosure may be reliably manufactured and includes the memory device 1200 having a stable 21' structure and improved characteristics, the characteristics of the memory system 1000 may also be improved.

Figure 12:
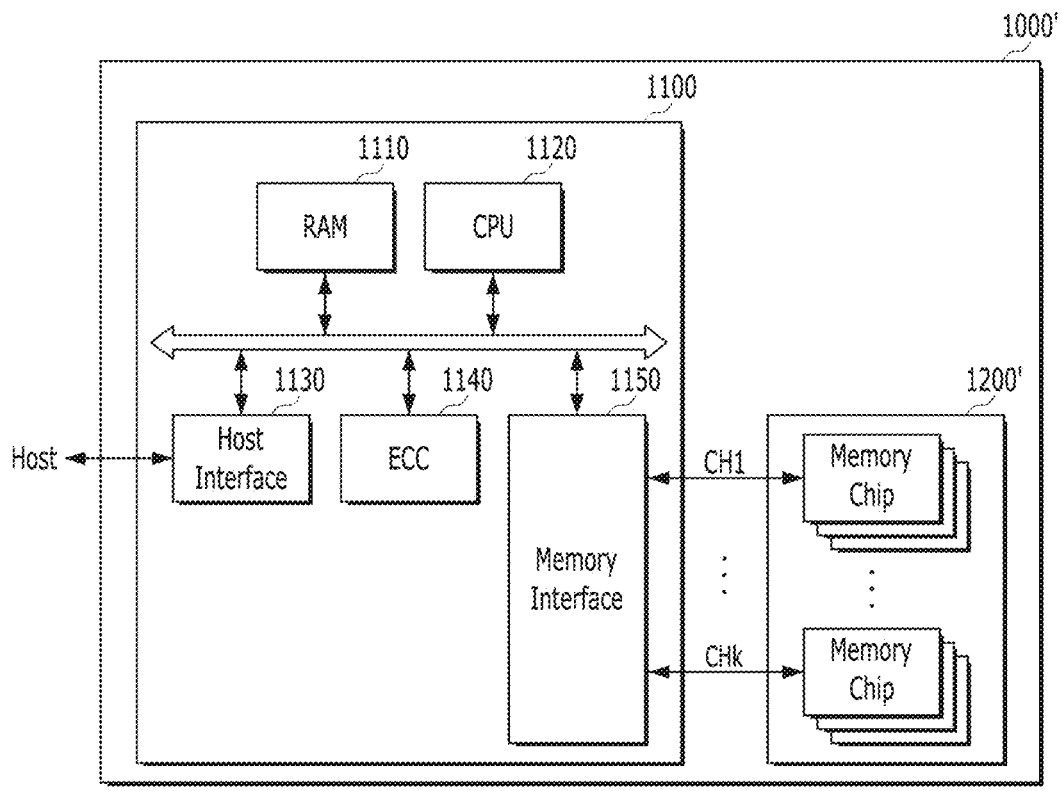
FIG. 12 is a block diagram of a configuration of a memory system according to an embodiment of the present disclosure.

FIG. 12 is a block diagram of a configuration of a memory system 1000' according to an embodiment of the present disclosure. Hereinafter, a description of common contents with the earlier described embodiment is omitted.

As illustrated in FIG. 12, the memory system 1000' may include a memory device 1200' and the controller 1100. In addition, the controller 1100 may include the RAM 1110, the CPU 1120, the host interface 1130, the ECC circuit 1140, and the memory interface 1150.

The memory device 1200' may be a non-volatile memory device. The memory device 1200' may be the semiconductor device described above with reference to FIGS. 4 to 10. In addition, the memory device 1200' may include an electrode structure including a plurality of gate conductive films stacked on a substrate and a channel array in which a plurality of channel columns passing through the electrode structure are arranged in a second direction. The plurality of channel columns may include a first column whose uppermost plane has a first shape and a second column whose uppermost plane has a second shape, and N (N is a natural number equal to or more than 1) first columns and N second columns are alternately arranged in a first direction crossing the second direction. In addition, the memory device 1200' may include an electrode structure including a plurality of gate conductive films stacked on a substrate and a channel array in which a plurality of channel columns passing through the electrode structure are arranged in a zigzag manner in a second direction. The plurality of channel columns includes a first column whose uppermost plane has a first shape and a second column whose uppermost plane has a second shape different from the first shape, and in any one row of the channel array, N (N is a natural number equal to or more than 1) first columns and M (M is a natural number equal to or more than 2) second columns are alternately arranged in a first direction crossing the second direction. Because the memory device 1200' is formed and manufactured in the above-described manner, a detailed description thereof will be omitted.

In addition, the memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips, included in a single group, may be suitable for communicating with the controller 1100 through a common channel. The memory system 1000' may be modified so that a single memory chip may be coupled to a single channel.

As described above, because the memory system 1000' according to an embodiment of the present disclosure may be reliably manufactured and includes the memory device 1200' having a stable structure and improved characteristics, the characteristics of the memory system 1000' may also be improved. In addition, the data storage capacity of the memory system 1000' may be further increased by forming the memory device 1200' using a multi-chip package.

Figure 13:
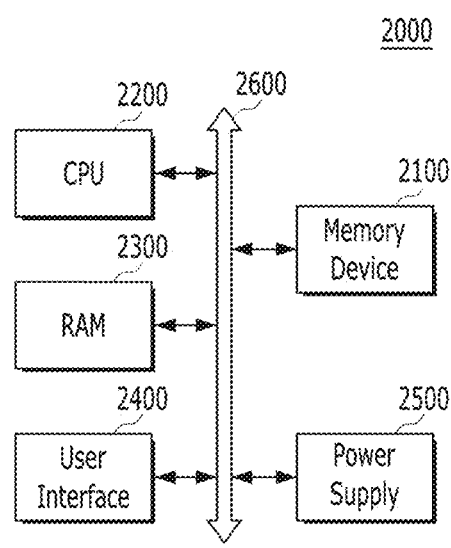
FIG. 13 is a block diagram of a configuration of a computing system according to an embodiment of the present disclosure.

FIG. 13 is a block diagram of a configuration of a computing system 2000 according to an embodiment of the present disclosure. Hereinafter, a description of common contents with the earlier described embodiments is omitted.

As illustrated in FIG. 13, the computing system 2000 may include a memory device 2100, a CPU 2200, a random-access memory (RAM) 2300, a user interface 2400, a power supply 2500, and a system bus 2600.

The memory device 2100 may store data, which is input through the user interface 2400, and data, which is processed by the CPU 2200. In addition, the memory device 2100 may be electrically coupled to the CPU 2200, the RAM 2300, the user interface 2400 and the power supply 2500. For example, the memory device 2100 may be coupled to the system bus 2600 through a controller (not illustrated) or directly coupled to the system bus 2600. When the memory device 2100 is directly coupled to the system bus 2600, functions of the controller may be performed by the CPU 2200 and the RAM 2300.

The memory device 2100 may be a non-volatile memory. In addition, the memory device 2100 may be the semiconductor memory device described above with reference to FIGS. 4 to 10. The memory device 2100 may include an electrode structure including a plurality of gate conductive films stacked on a substrate; and a channel array in which a plurality of channel columns passing through the electrode structure are arranged in a second direction, wherein the plurality of channel columns may include a first column whose uppermost plane has a first shape and a second column whose uppermost plane has a second shape, and N (N is a natural number equal to or more than 1) first columns and N second columns are alternately arranged in a first direction crossing the second direction. In addition, the memory device 2100 may include an electrode structure including a plurality of gate conductive films stacked on a substrate; and a channel array in which a plurality of channel columns passing through the electrode structure are arranged in a zigzag manner in a second direction, wherein the plurality of channel columns includes a first column whose uppermost plane has a first shape and a second column whose uppermost plane has a second shape different from the first shape, and in any one row of the channel array, N (N is a natural number equal to or more than 1) first columns and M (M is a natural number equal to or more than 2) second columns are alternately arranged in a first direction crossing the second direction. Because the memory device 2100 is formed and manufactured in the above-described manner, a detailed description thereof will be omitted.

In addition, as described above with reference to FIG. 12, the memory device 2100 may be a multi-chip package composed of a plurality of memory chips.

The computing system 2000 having the above-described configuration may be one of various components of an electronic device, such as a computer, an ultra mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for to computing systems, etc.

As described above, because the computing system 2000 according to an embodiment of the present disclosure may be reliably manufactured and includes a memory device 2100 having a stable structure and improved characteristics, the characteristics of the computing system 2000 may also be improved.

Figure 14:
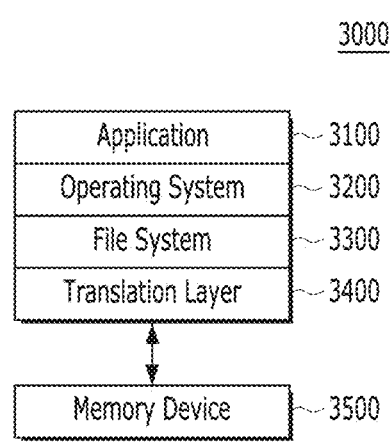
FIG. 14 is a block diagram of a computing system according to an embodiment of the present disclosure.

FIG. 14 is a block diagram of a computing system 3000 according to an embodiment of the present disclosure.

As illustrated in FIG. 14, the computing system 3000 may include a software layer that has an operating system 3100 an application 3200, a file system 3300 and a translation layer 3400. In addition, the computing system 3000 may include a hardware layer such as a memory system 3500.

The operating system 3100 manages software and hardware resources of the computing system 3000. The operating system 3100 may control program execution of a central processing unit. The application 3200 may include various application programs executed by the computing system 3000. The application 3200 may be a utility executed by the operating system 3100.

The file system 3300 may refer to a logical structure configured to manage data and files present in the computing system 3000. The file system 3300 may organize files or data to be stored in the memory device 3500 according to rules. The file system 3300 may be determined depending on the operating system 3100 that is used in the computing system 3000. For example, when the operating system 3100 is a Microsoft Windows-based system, the file system 3300 may be a file allocation table (FAT) or an NT file system (NTFS). In addition, when the operating system 3100 is a Unix/Linux-based system, the file system 3300 may be an extended file system (EXT), a Unix file system (UFS), or a journaling file system (JFS).

FIG. 14 illustrates the operating system 3100, the application 3200, and the file system 3300 in separate blocks. However, the application 3200 and the file system 3300 may be included in the operating system 3100.

The translation layer 3400 may translate an address to be suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL), or the like, The memory device 3500 may be a non-volatile memory. The memory device 3500 may be the semiconductor memory device described above with reference to FIGS. 4 to 10. In addition, the memory device 3500 may include an electrode structure including a plurality of gate conductive films stacked on a substrate; and a channel array in which a plurality of channel columns passing through the electrode structure are arranged in a second direction, wherein the plurality of channel columns may include a first column whose uppermost plane has a first shape and a second column whose uppermost plane has a second shape, and N (N is a natural number equal to or more than 1) first columns and N second columns are alternately arranged in a first direction crossing the second direction. In addition, the memory device 3500 may include an electrode structure including a plurality of gate conductive films stacked on a substrate; and a channel array in which a plurality of channel columns passing through the electrode structure are arranged in a zigzag manner in a second direction, wherein the plurality of channel columns may include a first column whose uppermost plane has a first shape and a second column whose uppermost plane has a second shape different from the first shape, and in any one row of the channel array, N (N is a natural number equal to or more than 1) first columns and M (M is a natural number equal to or more than 2) second columns are alternately arranged in a first direction crossing the second direction. Because the memory device 3500 is formed and manufactured in the above-described manner, a detailed description thereof will be omitted.

The computing system 3000 having the above-described configuration may be divided into an operating system layer that is operated in an upper layer region and a controller layer that is operated in a lower level region. The operating system 3100, the application 3200, and the file system 3300 may be included in the operating system layer and driven by an operation memory. In addition, the translation layer 3400 may be included in the operating system layer or the controller layer.

As described above, because the computing system 3000 according to an embodiment of the present disclosure may be reliably manufactured and includes a memory device 3500 having a stable structure and improved characteristics, the characteristics of the computing system 3000 may also be improved Although the present disclosure has been described in detail with reference to the preferred embodiments, the present disclosure is not limited to the embodiments and various modifications can be made by those skilled in the art within the technical scope of the present disclosure.

What is claimed is:

1. A semiconductor memory device comprising:
an electrode structure including a plurality of gate conductive films stacked over a substrate; and
a channel array in which a plurality of channel columns disposed in the electrode structure,
wherein the plurality of channel columns includes at least one first column and at least one second column, an upper surface of the first column includes a first shape, an upper surface of the second column includes a second shape different from the first shape, and the upper surface of the first column and the upper surface of the second column are coplanar, and
wherein the first column and the second column are alternately arranged in a first direction.

2. The semiconductor memory device according to claim 1,
wherein, in the channel array, plane centers of the plurality of channel columns are aligned with each other in the first direction, the first column and the second column are arranged in a zigzag manner in a second direction different from the first direction, and
wherein among the plurality of channel columns, the plane centers of the channel columns located in odd-numbered rows are aligned with each other in the second direction, and the plane centers of the channel columns located in even-numbered rows are aligned with each other in the second direction.

3. The semiconductor memory device according to claim 1,
wherein, in the channel array, plane centers of the plurality of channel columns are aligned with each other in each of the first direction and the second direction, and
wherein N first columns and N second columns are alternately arranged in the second direction, the N is a natural number greater than or equal to 1, and the N, which is the number of first columns, and the N, which is the number of second columns, are equal to or different from each other.

4. The semiconductor memory device according to claim 1,
wherein, in the channel array, plane centers of the plurality of channel columns are aligned with each other in a diagonal direction having a slope relative to the first direction, and 2N first columns and 2N second columns are alternately arranged in the diagonal direction, and wherein the N is a natural number greater than or equal to 1, and the N, which is the number of first columns, and the N, which is the number of second columns, are equal to or different from each other.

5. The semiconductor memory device according to claim 1, wherein, in the channel array, plane centers of the plurality of channel columns are aligned with each other in a diagonal direction having a slope relative to the first direction, and the plurality of channel columns arranged along the diagonal direction include the upper surfaces with the same shape, respectively.

6. The semiconductor memory device according to claim 1, wherein the first shape comprises a circular shape and the second shape comprises an elliptical shape having a long axis and a short axis, and wherein a length of the short axis of the second shape is less than a diameter of the first shape and a length of the long axis of the second shape is substantially equal to or greater than the diameter of the first shape.

7. The semiconductor memory device according to claim 6, wherein the long axis of the second shape is extended in a second direction different from the first direction or is extended in a diagonal direction having a slope relative to the first direction.

8. The semiconductor memory device according to claim 6, wherein, in the channel array, the long axis of the second shape of each of the second columns located in odd-numbered rows in the second direction is extended in a first diagonal direction having a slope relative to the first direction, and wherein the long axis of the second shape of each of the second columns located in even-numbered rows in the second direction is extended in a second diagonal direction different from the first diagonal direction.

9. The semiconductor memory device according to claim 1, wherein the first shape comprises a circular shape;

wherein the second shape comprises an elliptical shape having a long axis and a short axis;

wherein a lowermost plane of each of the plurality of channel columns has a third shape substantially equivalent to the first shape; and wherein a diameter of the third shape is substantially equal to or less than a length of the short axis of the second shape.

10. The semiconductor memory device according to claim 1, wherein each of the plurality of channel columns comprises:

an open part configured to pass through the electrode structure;

a memory film formed on a sidewall of the open part to contact the plurality of gate conductive films and including a tunnel insulating film, a charge trap film, and a blocking film sequentially stacked in the open part;

a channel film formed on the memory film;

a core film formed on the channel film and configured to partially gap-fill the open part; and a capping film formed on the core film and configured to gap-fill a remaining open part, and electrically connected to the channel film.

11. A semiconductor memory device comprising:

an electrode structure including a plurality of gate conductive films stacked on a substrate; and a channel array including a plurality of channel columns disposed in the electrode structure in a first direction and a second direction cross to the first direction, the plurality of channel columns arranged in a zigzag manner in the second direction and the plurality of channel columns having a same height, wherein the plurality of channel columns includes at least one first columns and at least one second columns, the first column includes an upper surface with a first shape, the second column includes an upper surface with a second shape different from the first shape, and wherein the first column and the second column are alternately arranged along the first direction in a selected row.

12. The semiconductor memory device according to claim 11, wherein, in odd-numbered rows of the channel array, N first columns and M second columns are alternately arranged in the first direction, in even-numbered rows of the channel array, M first columns and N second columns are alternately arranged in the first direction, and wherein the N is a natural number greater than or equal to 1, and the M is natural number different from the N.

13. The semiconductor memory device according to claim 11, wherein, in the channel array, plane centers of the plurality of channel columns are aligned with each other in the first direction, and wherein among the plurality of channel columns, the plane centers of the channel columns located in odd-numbered rows are aligned with each other in the second direction and the plane centers of the channel columns located in even-numbered rows are aligned with each other in the second direction.

14. The semiconductor memory device according to claim 11, wherein, in the channel array, plane centers of the plurality of channel columns are aligned with each other in a diagonal direction having a slope relative to the first direction, and 2N first columns and 2M second columns are alternately are arranged in the diagonal direction.

15. The semiconductor memory device according to claim 11, wherein, in the channel array, plane centers of the plurality of channel columns are aligned with each other in a diagonal direction having a slope relative to the first direction, and wherein the upper surfaces of the plurality of channel columns arranged along the diagonal direction include the same shape.

16. The semiconductor memory device according to claim 11, wherein the first shape comprises a circular shape and the second shape comprises an elliptical shape having a long axis and a short axis, and wherein a length of the short axis of the second shape is less than a diameter of the first shape and a length of the long axis of the second shape is substantially equal to or greater than the diameter of the first shape.

17. The semiconductor memory device according to claim 16, wherein the long axis of the second shape is extended in the second direction or is extended in a diagonal direction having a slope relative to the first direction.

18. The semiconductor memory device according to claim 16,
wherein, in the channel array, the long axis of the second shape of each of the second columns located in the odd-numbered rows in the second direction is extended in a first diagonal direction having a slope based on the first direction, and the long axis of the second shape of each of the second columns located in the even-numbered rows in the second direction is extended in a second diagonal direction different from the first diagonal direction.

19. The semiconductor memory device according to claim 11,
wherein each of the first columns includes a first bottom surface corresponding to the first shape,
wherein each of the second columns includes a second bottom surface corresponding to the second shape,
wherein the first shape includes a circular shape, and
wherein the second shape includes an elliptical shape having a long axis and a short axis.

20. A memory device, comprising:
a memory block including an insulating layer and a conductive layer which are at least once sequentially stacked; and
a plurality of vertical channel structures formed in the memory block, the plurality of vertical channel structures including at least one first vertical channel structure with a first upper shape and at least one second vertical channel structure with a second upper shape different from the first upper shape, and the first vertical channel structure and the second vertical channel structure include the same height and the first vertical channel structure is spaced apart from the second vertical channel structure.

* * * * *